US005568109A

United States Patent [19]

Takayama

[11] Patent Number: 5,568,109
[45] Date of Patent: Oct. 22, 1996

[54] NORMAL CONDUCTING BENDING ELECTROMAGNET

[75] Inventor: Takeshi Takayama, Sayama, Japan

[73] Assignee: Sumitomo Heavy Industries, Ltd., Tokyo, Japan

[21] Appl. No.: 363,005

[22] Filed: Dec. 22, 1994

[30] Foreign Application Priority Data

Dec. 28, 1993 [JP] Japan .................................... 5-337241

[51] Int. Cl.[6] .................................................. H01J 37/147
[52] U.S. Cl. .......................... 335/213; 335/297; 335/299; 250/396 ML; 315/503
[58] Field of Search .................................... 335/210–213, 335/216, 296–299; 250/396 ML; 315/501–505

[56] References Cited

U.S. PATENT DOCUMENTS

| | | | |
|---|---|---|---|
| 3,659,236 | 4/1972 | Whitehead, Jr. . | |
| 3,787,790 | 1/1974 | Hull et al. . | |
| 4,723,116 | 2/1988 | Muller et al. . | |
| 4,916,404 | 4/1990 | Tsumaki et al. . | |
| 5,132,544 | 7/1992 | Glavish | 250/492.2 |

FOREIGN PATENT DOCUMENTS

| | | |
|---|---|---|
| 0245755A2 | 11/1987 | European Pat. Off. . |
| 0296587A1 | 12/1988 | European Pat. Off. . |

OTHER PUBLICATIONS

Proceedings Of The 1993 Particle Accelerator Conference, Washington, D.C., USA, May 17–20, 1993, vol. 4, pp. 2829–2831, Harding et al, "Design and Measurements of Prototype Fermilab Main Injector Dipole Endpacks".

Patent Abstracts Of Japan, vol. 12, No. 367 (E–664) Sep. 30, 1988 & JP-A-63 117 646 (Shibaura Eng. Works) May 21, 1988.

*Primary Examiner*—Brian W. Brown
*Assistant Examiner*—Raymond M. Barrera
*Attorney, Agent, or Firm*—Frishauf, Holtz, Goodman, Langer & Chick

[57] ABSTRACT

A normal conducting bending electromagnet having: a pair of pole pieces having respective pole piece faces, said pole pieces being; disposed with the pole piece faces thereof facing each other with a substantially constant gap therebetween; a magnetic field for forming a charged particle beam arc orbit, being generated in the gap between the pole pieces. A yoke coupled to the pole pieces for forming a closed magnetic circuit with the gap, and a pair of coils is provided for generating a magnetomotive force and generating magnetic fluxes in the magnetic circuit. At least one side wall of each of the pole pieces is slanted or stepped along a virtual slanted plane; along the magnetic path of the pole piece so as to gradually broaden the cross sectional area of the pole piece at the plane perpendicular to the magnetic path from the gap toward the yoke, the slanted side wall or the virtual slanted plane; having a slant angle in the range from 30° or smaller relative to the pole piece faces, the width of the pole piece face being in the range from 4 cm or wider to 20 cm and the height of the gap along the magnetic path being in the range from 1 cm or higher to 6 cm. The normal conducting bending electromagnet can generate a strong magnetic field and reduce the orbit radius of an electron storage ring.

13 Claims, 13 Drawing Sheets

70
60
50
40
30
20
10
HEIGHT (cm)
25
55
85
115
145
175
WIDTH (cm)

70
60
50
40
30
20
10
HEIGHT (cm)
25
55
85
115
145
175
WIDTH (cm)

70
60
50
40
30
20
10
HEIGHT (cm)
25
55
85
115
145
175
WIDTH (cm)

NORMAL CONDUCTING BENDING ELECTROMAGNET

BACKGROUND OF THE INVENTION

1. Field of the Invention

The present invention relates to a normal conducting type electromagnet for bending a charged particle beam, particularly an electromagnet adapted for use in a synchrotron radiation beam (hereinafter called SR beam) generator.

2. Description of the Related Art

An SR beam generator radiates SR beams from predetermined positions by accelerating electrons (or positrons) along a predetermined orbit to near the light speed. Various types of SR beam generators have been proposed. There is a strong need of a compact SR beam generator. An SR beam generator having an orbit radius of about 0.5 m has been in a practical use.

FIG. 11 is a schematic diagram showing the structure of an SR beam generator of a racetrack type using an electron storage ring. A pair o-f semicircular orbits having a curvature R are formed by two bending electromagnets 51*a* and 51*b*. The pair of semicircular orbits are coupled by two straight orbits to form a racetrack type orbit 50 in a vacuum container. Disposed along the straight orbits are four first quadrupole electromagnets 52*a*, 52*b*, 52*c*, and 52*d*, four second quadrupole electromagnets 52*a*, 52*b*, 52*c*, and 53*d*, an RF accelerator cavity 54, and an incident beam kicker electromagnet 55 disposed at an electron beam input position.

An electron beam generated by an injection beam accelerator (not shown) is introduced from the electron beam input position into the vacuum container, accelerated and deflected to have a preset curvature respectively by the RF accelerator cavity 54 and the bending electromagnets 51*a* and 51*b* to circulate the beam along the orbit 50 at near the light speed.

Examples of conventional bending electromagnets are shown in FIGS. 12A and 12B, and 13A and 13B.

FIG. 12A is a partial plan view of a conventional bending electromagnet, and FIG. 12B is a cross sectional view of the electromagnet taken along one-dot chain line B12—B12 shown in FIG. 12A.

As shown in FIG. 12A, a coil 63 is wound around a pair of arc pole pieces 61.

As shown in FIG. 12B, a gap 64 defining part of an electron orbit Is formed between the pair of pole pieces 61. A yoke 62 surrounds the pole pieces 61 and coil 63 to form a magnetic circuit 65 constituted by the yoke 62, pole pieces 61, and gap 64.

A magnetomotive force required by a coil increases rapidly if the magnetic flux density greater than the saturation flux density of the pole pieces is to be obtained. The bending electromagnet having the structure and shape shown in FIGS. 12A and 12B has a largest magnetic flux density at the pole pieces 61 near the yoke 62 so that as the magnetomotive force is increased, the magnetic saturation occurs first at this area.

In the bending electromagnet shown in FIGS. 13A and 13B, a coil is wound also around a gap as different from the electromagnet shown in FIGS. 12A and 12B. FIG. 13A is a plan view of the bending electromagnet, and FIG. 13B is a cross sectional view taken along one-dot chain line B13—B13 shown in FIG. 13A.

Pole pieces 71, a yoke 72, a coil 73*a*, and a gap 74 have the similar structures as the pole pieces 61, yoke 62, coil 63, and gap 64 shown in FIGS. 12A and 12B. A coil 73*b* is wound also around the gap 74 as different from the bending electromagnet shown in FIGS. 12A and 12B. The coil 73*b* functions to increase a magnetomotive force and to improve a uniformity of a magnetic field distribution in the gap 74. In order not to be an obstacle of the electron orbit, the coil 73*b* is curved and bent down or up at opposite ends of the gap 74 in the circumferential direction.

This arrangement shown in FIGS. 13A and 13B is particularly effective for an electromagnet having a large gap 74. However, an SR beam is not radiated from the electromagnet of this type so that this electromagnet cannot be used as an electron storage ring.

There are superconducting and normal conducting bending electromagnets. Although the superconducting bending electromagnet can generate a strong magnetic field, the system using this electromagnet becomes bulky and complicated because of related apparatuses. Furthermore, a highly sophisticated manufacturing technique and a large number of manufacturing processes arc required, resulting in a high cost.

The saturated magnetic flux density of iron forming a normal conducting electromagnet is in the order of 2.15 teslas at most. If a magnetic flux density of 2.15 teslas or higher is to be generated, a required magnetomotive force increases rapidly. From this reason, the normal conducting electromagnet has been generally used at 2.15 teslas or lower.

The orbit radius of a bending electromagnet of an SR beam generator is determined by a magnetic field. The stronger the magnetic field, the smaller the orbit radius. This magnetic field intensity constraint has made it more difficult to provide a compact electron storage ring of a normal conducting bending electromagnet than a superconducting bending electromagnet.

SUMMARY OF THE INVENTION

It is an object of the present invention to provide a normal conducting bending electromagnet capable of generating a strong magnetic field and reducing the orbit radius of an electron storage ring.

According to one aspect of the present invention, there is provided a normal conducting bending electromagnet including: a pair of pole pieces disposed with the pole piece faces being faced each other, a magnetic field-for forming a charged particle beam arc orbit being generated in a gap between the pole pieces; a yoke coupled to the pole pieces for forming a closed magnetic circuit with the gap; and a pair of coils for generating a magnetomotive force and generating magnetic fluxes in the magnetic circuit, wherein: at least one side wall of each of the pole pieces is slanted at least partially along the magnetic path of the pole pieces, the slanted side wall having a slant angle in the range from 30° or larger to 60° or smaller relative to the pole piece faces, and the pole piece width at the plane coupling to the yoke being set wider than the width of the pole piece faces with the gap being interposed therebetween; the width of the pole piece face is in the range from 4 cm or wider to 20 cm or narrower; and the height of the gap along the magnetic path is in the range from 1 cm or higher to 6 cm or lower.

Both the side walls of each of the pole pieces may be slanted along the magnetic path of the pole pieces, the slanted side wall having a slant angle in the range from 30° or larger to 60° or smaller relative to the pole piece faces. In this case, the width of the pole piece face is preferably in the range from 4 cm or wider to 40 cm or narrower.

The relationship between $Y_o$, a, h, and w is preferably set so as to satisfy $$B_o/2.15 - \tfrac{1}{2} \cdot (1 - h/a/w)^{-2} \cdot [\ln(1 + y_o/a/w) - y_o/(aw + y_o)] - \tfrac{1}{2} \cdot [1 - (1 - h/a/w)^{-2}] \cdot [\ln(1 + y_o/h) - aw/h \cdot y_o/(aw + y_o)] < 1$$

in order to generate a magnetic field having a magnetic flux density $B_o$ (tesla) in the gap, wherein $y_o$ (cm) represents a height at a point on the slanted side wall of each of the pole pieces along the magnetic path, a represent a tangent of the slant angle, h (cm) represents a half of the height of the gap along the magnetic path, w (cm) represents a width of the pole piece face if at least one side wall is slanted at least partially, or a half of the width of the pole piece face if both side walls are slanted.

The normal conducting bending electromagnet may further include a controller for controlling a current flowing through the pair of coils so as to generate a magnetic field having a magnetic flux density in the range from 2.15 teslas or higher to 3 teslas or lower and to set the magnetic flux density in the pole pieces to 2.15 teslas or higher at the pole piece face and to 2.1.5 teslas or lower at the plane coupling to the yoke.

According to another aspect of the present invention, there is provided a normal conducting bending electromagnet including: a pair of pole pieces disposed with the pole piece faces being faced each other, a magnetic field for forming a charged particle beam are orbit being generated in a gap between the pole pieces; a yoke coupled to the pole pieces for forming a closed magnetic circuit with the gap; and a pair of coils for generating a magnetomotive force and generating magnetic fluxes in the magnetic circuit, wherein at least one side wall of each of the pole pieces along the magnetic path is formed stepwise having one step, and the relationship between $w_y$, $w_g$, h, and $h_1$, is set so as to satisfy $$(w_y - w_g)h_1/[w_y(h+h_1)] > B_o/2.15 - 1$$

in order to generate a magnetic field having a magnetic flux density $B_o$ (tesla) in the gap, wherein $w_y$ (cm) represents a width of the pole piece on the yoke side, $w_g$ (cm) represents a width of the pole piece on the gap side, $h_1$ (cm) represents a height of the step, and h (cm) represents a half height of the gap along the magnetic path.

in the normal conducting bending electromagnet including: a pair of pole pieces disposed with the pole piece faces being faced each other, a magnetic field for forming a charged particle beam arc orbit being generated in a gap between the pole pieces; a yoke coupled to the pole pieces for forming a closed magnetic circuit with the gap; and a pair of coils for generating a magnetomotive force and generating magnetic fluxes in the magnetic circuit, at least one side wall of each of the pole pieces along the magnetic path may be formed stepwise having one step so as to set the pole piece width on the yoke side wider than the pole piece width on the gap side, and the normal conducting bending electromagnet may further include a controller for controlling a current flowing through the pair of coils so as to set the magnetic flux density in the pole pieces to 2.15 teslas or higher at the narrower pole piece width region on the gap side and to 2.15 teslas or lower at the broader pole piece with region on the yoke side.

Both the side walls of each of said pole pieces may be formed with one step along the magnetic path.

By gradually broadening the cross sectional area of a pole piece from the gap toward the yoke, the magnetization saturation of the pole piece near the yoke can be relieved. With this arrangement, it becomes possible for a normal conducting coil to generate a magnetic field having a magnetic flux density of about 3 teslas in the gap while suppressing the magnetic flux density of the pole piece near the yoke to 2.15 teslas or lower.

The side wall of a pole piece may be formed stepwise having one step so as to set the pole piece width near the yoke broader than that near the gap. Also with this arrangement, it becomes possible for a normal conducting coil to generate a magnetic field having a magnetic flux density of about 3 teslas in the gap while suppressing the magnetic flux density of the pole piece near the yoke to 2.15 teslas or lower.

As described above, a strong magnetic field having a magnetic flux density of about 3 teslas can be obtained by using a normal conducting coil. A compact electron storage ring can be formed with a low cost.

DETAILED DESCRIPTION OF THE PREFERRED EMBODIMENTS

The outline of the embodiments of the invention will be described with reference to FIGS. 1A and 1B, and 2A and 2B.

Figure 1A:
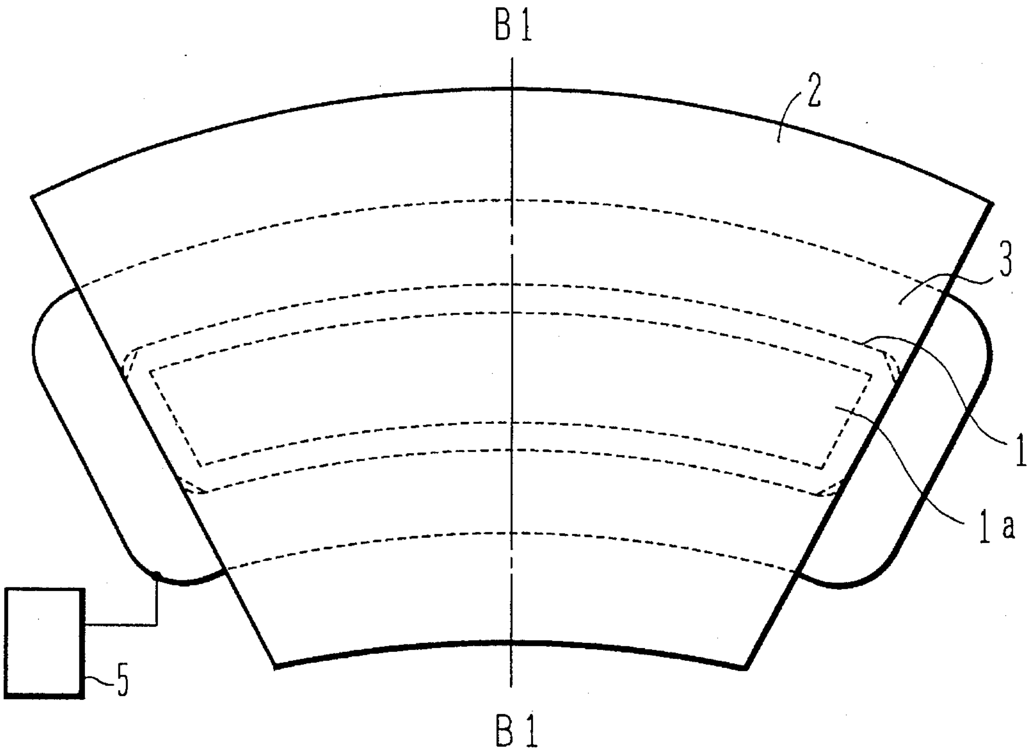
FIG. 1A is a plan view of a bending electromagnet according to an embodiment of the invention.
Figure 1B:
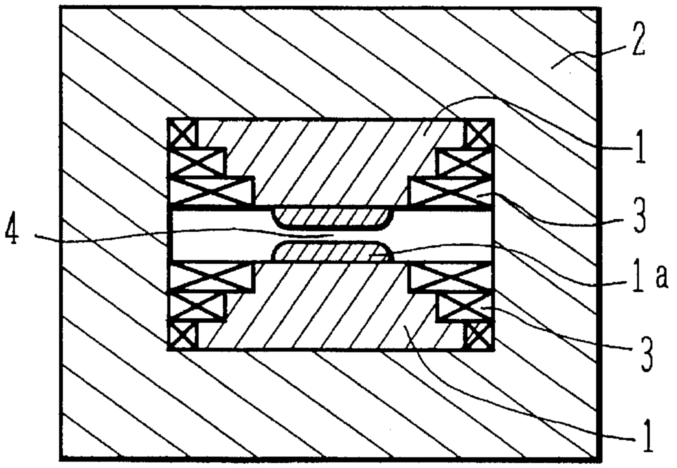
FIG. 1B is a cross sectional view of the electromagnet taken along one-dot chain line B1—B1 shown in FIG. 1A.

FIG. 1A is a plan view of a bending electromagnet according to an embodiment of the invention, and FIG. 1B is a cross sectional view of the electromagnet taken along one-dot chain line B1–B shown in FIG. 1A.

As shown in FIG. 1B, a pair of pole pieces 1 are disposed interposing therebetween a gap 4 defining an electron storage ring. A Rogowskii pole piece tip la is formed at the face of each pole piece so as to make the magnetic field in the gap 4 uniform. A coil 3 is wound in an arc shape around the pole pieces 1 as shown in FIG. 1A. A controller 5 is connected to the coil 3 to supply a predetermined amount of current.

As shown in FIG. 1B, a yoke 2 is formed surrounding the pole pieces 1, pole piece tips la, and coil 3. A magnetic circuit is formed by the pole pieces 1, pole piece tips la, gap 4, and yoke 2. The coil 3 is wound on the whole side wall of the pole pieces 1, excepting the pole piece tips la.

The width of the pole piece 1 becomes broader from the gap 4 toward the yoke 2 so that saturation off the magnetic flux density of the pole piece 1 near the yoke 2 can be relieved. The cross section of the coil 3 is preferably made in conformity with the side wall of the pole piece 1 in order to increase the cross sectional area of the coil 3. The cross section of the coil in conformity with the side wall of the pole piece provides the effects of shielding a magnetic field leaked from the pole piece 1.

Figure 2A:
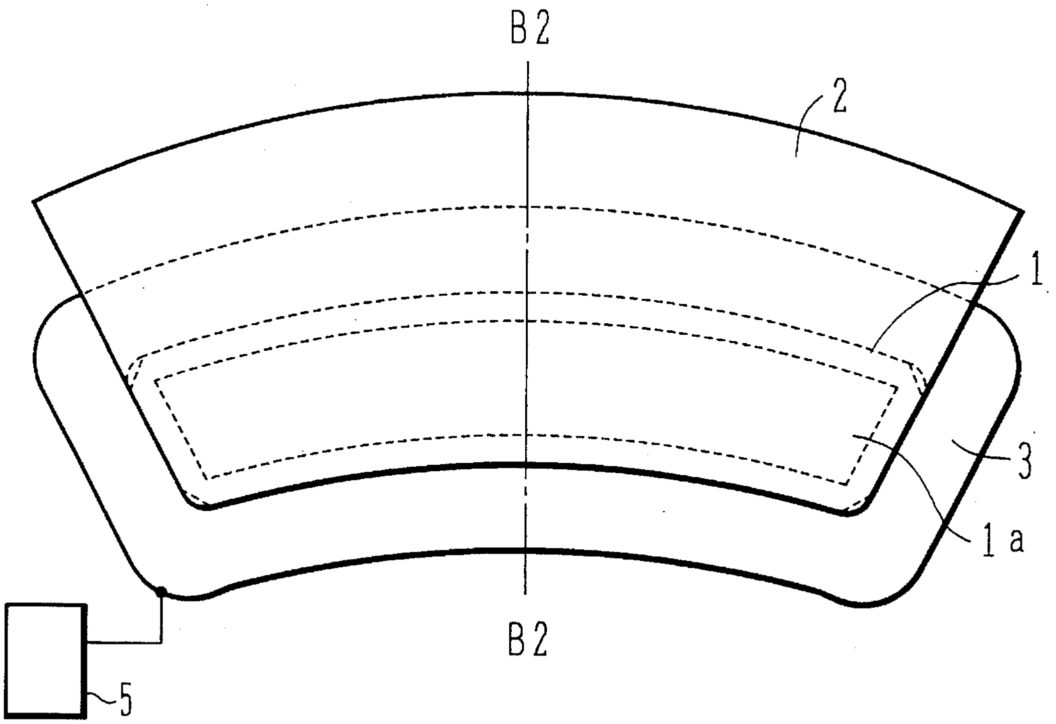
FIG. 2A is a plan view off a bending electromagnet according to another embodiment of the invention.
Figure 2B:
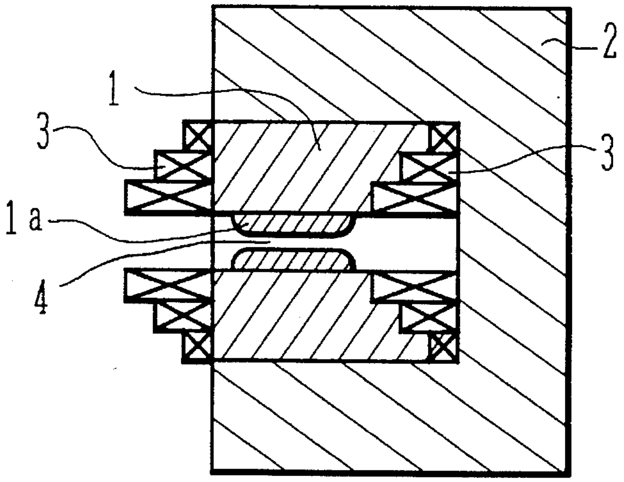
FIG. 2B is a cross sectional view of the electromagnet taken along one-dot chain line B2—B2 shown in FIG. 2A.

FIG. 2A is a plan view of a bending electromagnet according to another embodiment of the invention, and FIG. 2B is a cross sectional view of the electromagnet taken along one-dot chain line B2—B2 shown in FIG. 2A. In this embodiment, the side wall of a pole piece on the inner circumference side of the electron storage ring is made perpendicular to the pole piece face at a gap 4, and a yoke 2 is disposed only on the outer circumference side of the electron storage ring.

If the curvature of a bending electromagnet is small, the cross sectional area of the pole piece perpendicular to the magnetic path is small on the inner circumference side. In such a case, even IF the side wall of the pole piece on the inner circumference side is made slanted, the effects of relieving magnetic saturation are small.

The embodiment shown in FIGS. 2A and 2B has therefore generally the same effects as the embodiment shown in FIGS. 1A and 1B. The yoke is disposed only on the ring outer circumference from the same reason discussed above.

The principle of the embodiments of the invention will be described with reference to FIG. 7, FIGS. 8A and 8B, and FIG. 9.

Figure 7:
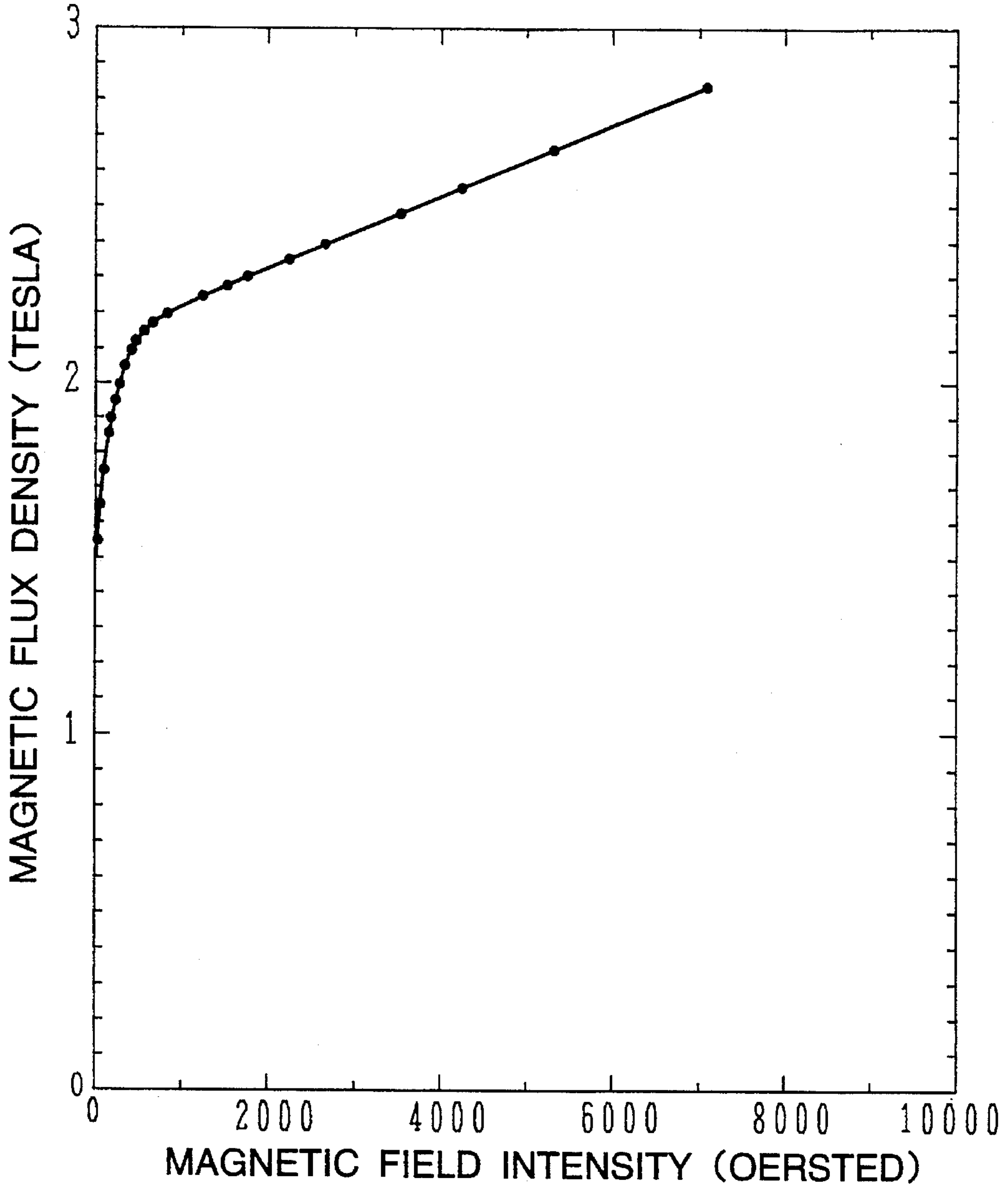
FIG. 7 is a graph showing the magnetization curve of iron.

FIG. 7 shows the magnetization curve of iron. The abscissa represents a magnetic field intensity in unit of oersted, and the ordinate represents a magnetic flux density in unit of tesla. In the range from 0 to 2.15 teslas, the magnetic flux density rapidly increases as the magnetic field intensity becomes strong. However, in the range over 2.15 teslas, the magnetization curve and the magnetic reluctance become the same as those of air if a magnetic flux density of iron is required to be 2.15 teslas or higher, a superconducting coil has generally been used.

File inventor has found that a normal conducting coil can generate a magnetic flux density of about 3 teslas with a practical power consumption if the shape of a bending electromagnet is devised.

In the discussion to follow, the magnetization curve of iron is idealized and approximated as in the following.

The saturated magnetic flux density $B_s$ of iron is 2.15 T (T is the unit of tesla), the magnetic field intensity H is 0 at the magnetic flux density of $B_s$ or lower, and the magnetic field intensity ti is $B-B_s$ at the magnetic flux density higher than $B_s$. The permeability of air is assumed to be 1, for the simplicity of discussion.

First, the slanted side wall of a pole piece of a bending electromagnet will be explained with reference to FIG. 8A and 8B.

Figure 8A:
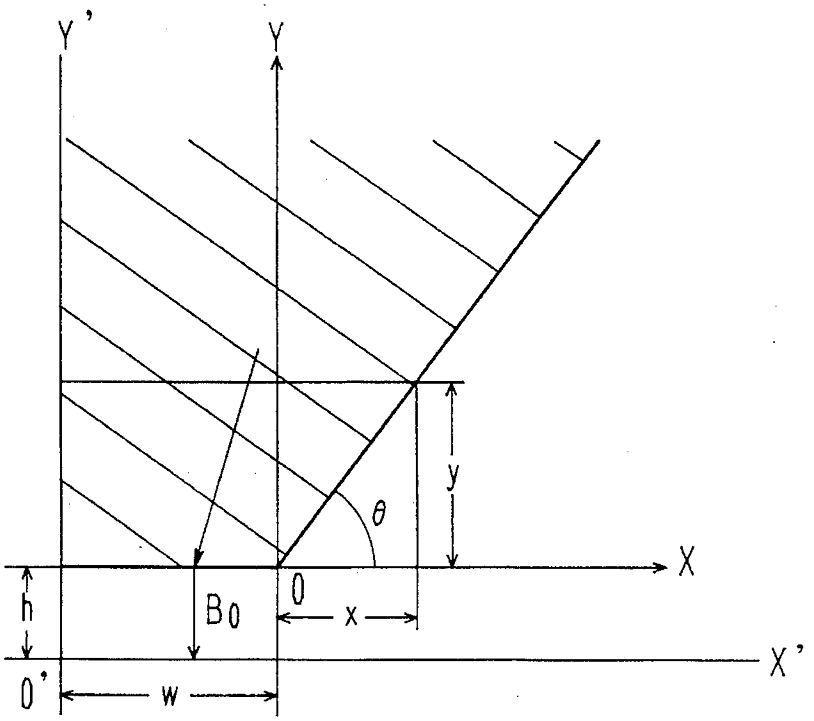
FIG. 8A is a partial cross sectional view of a pole piece explaining the principle off an embodiment of the invention.
Figure 8B:
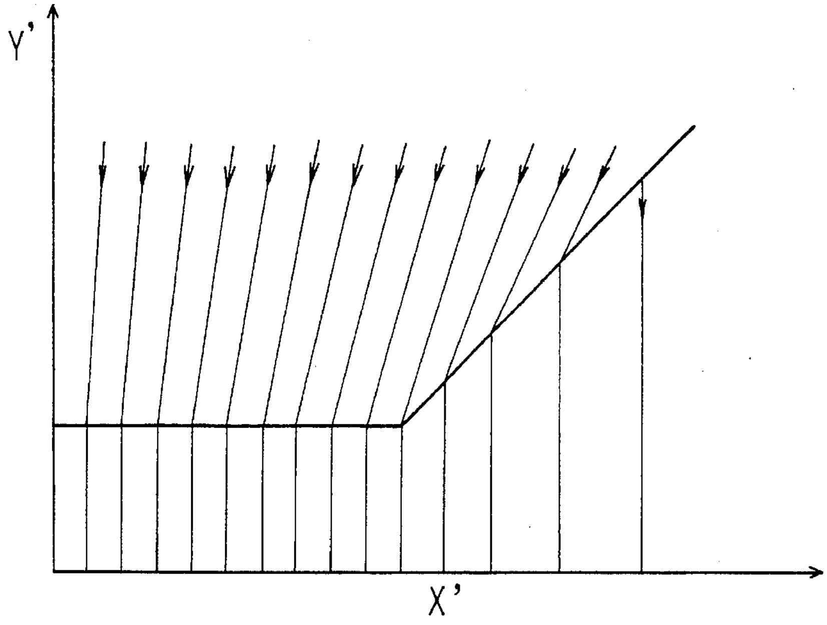
FIG. 8B shows magnetic fluxes passing through the pole piece shown in FIG. 8A.

FIG. 8A is a partial cross sectional view showing a quarter of pole pieces (a half of one pole piece) of a bending electromagnet. The electromagnet is assumed to have an infinite length in the vertical direction as viewed on the drawing sheet. The pole piece has a face in parallel with X' axis, and is symmetrical with Y' axis. The other pole piece is disposed symmetrical with X' axis. As shown in FIG. 8A, the gap height is 2*h*, the pole piece width at the gap is 2*w*, and the angle between the pole piece side wall and the pole piece face is Θ. For the simplicity of calculation, it is assumed as shown in FIG. 8B that the magnetic flux lines in air are aligned in a direction Y and the magnetic flux density of iron is uniform in a direction X.

Consider the coordinate system having as its origin O an intersection between the pole piece side wall and the pole piece face. The side wall is slanted by an angle θ from a line (X axis) extending straight from the pole piece face. A height y of the side wall at x is given by:

$$y=x\tan(\Theta) \quad (1)$$

in this equation, tan (Θ)=a

Fluxes Φ (y) in iron at the height h is given by:

$$\Phi(y)=B_o w+\int_o B_{air}(X)\,dx \quad (2)$$

where $B_o$ is a magnetic flux density in the gap between the pole pieces, and $B_{air}$ (x) is a magnetic flux density in air assuming that the density is a function of only x. The integration is from 0 to x used in the equation (1).

The magnetic flux density in iron is assumed to be uniform in the direction X and to be given by a function of only The magnetic flux density $B_{iron}$ (y) is then given by:

$$B_{iron}(y)=\Phi(y)/(w+x) \quad (3)$$

In the range or $B_{iron} > B_s$, i.e., in the range over the saturated magnetic flux of iron the magnetic potential ψ(y) in iron is given by using a center of the gap as a reference, by:

$$\psi(y)=B_o h+\int_o^y[B_{iron}(y)-B_s]\,dy \quad (4)$$

The magnetic potential ψ(y) in iron is given by paying attention to the side wall region of the pole piece, by:

$$\psi(y)=B_{air}(x)\cdot(h+y) \quad (5)$$

The equations (2) to (5) are solved by using the equation (1). The results are:

$$\begin{aligned} B_{air}(x) = {} & B_o - 1/2\cdot B_s\cdot \ln(x/w+1) + \\ & 1/2\cdot B_s\cdot[1-(1-h/a/w)^{-2}]\cdot \\ & (\ln[(1+x/w)/[1+x/(h/a)]]+ \\ & (w-h/a)\cdot[a/h-1/(x+h/a)]) \end{aligned} \quad (6)$$

$$\begin{aligned} B_{iron}(y) = {} & B_o - 1/2\cdot B_s\cdot(1-h/a/w)^{-2}\cdot \\ & [\ln(1+y/a/w)-y/(aw+y)] - \\ & 1/2\cdot B_s\cdot[1-(1-h/a/w)^{-2}]\cdot \\ & [\ln[(1+y/h)-aw/h\cdot y/(aw+y)] \end{aligned} \quad (7)$$

-continued $$\Psi(y) = B_oh + (B_o - B_s)y - 1/2 \cdot B_s(1 - h/a/w)^{-2} \cdot [(y + 2aw) \cdot \ln(1 + y/a/w) - 2y] - 1/2 \cdot B_s[1 - (1 - h/a/w)^{-2}] \cdot [(y + h) \cdot \ln(1 + y/h) - (1 + aw/h)y + a^2w^2/h \cdot \ln(1 - y/a/w)] \quad (8)$$

The magnetic potential ψ(y) of the equation (4) is a constant in the range of $B_{iron}<B_s$ where the magnetic field intensity It is assumed to be 0. If $B_{iron}(y)<B_s$ in the equation (7), iron is not saturated at the height y satisfying this equation, and the magnetic potential is a constant.

Representing the height y satisfying the condition of $B_{iron}(y)=B_s$ by ys, the magnetic potential ψ(y) at this height is a magnetomotive force required for obtaining a magnetic flux density $B_o$ in the gap. Regardless of the saturated magnetic flux density in the region lower than the height ys, the magnetic flux density in the region higher than the height ys is 2.15 T or lower because of the broader pole piece. With a slanted pole piece side wall, it becomes possible to generate a magnetic field having a saturated magnetic flux density or higher in the gap, without the saturated magnetic flux of the pole piece near the yoke.

Figure 9:
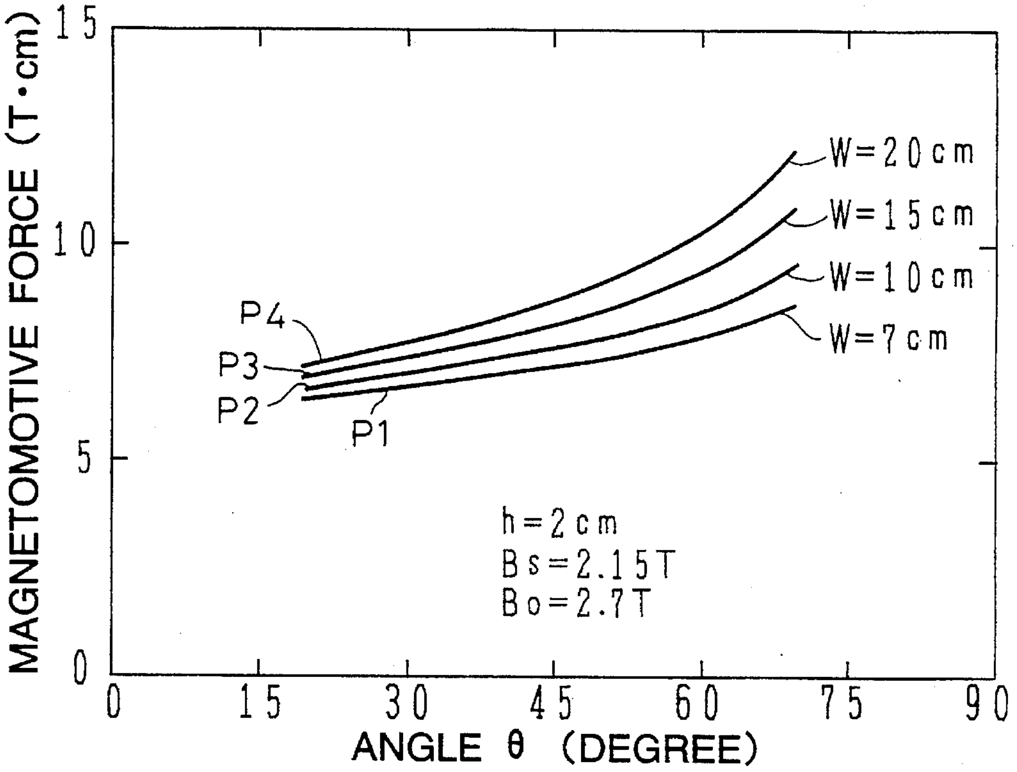
FIG. 9 is a graph showing a magnetomotive force relative to a slant angle, the magnetomotive force generating 2.7 teslas in the pole piece shown in FIG. 8A.

FIG. 9 is a graph showing a magnetomotive force relative to a slant angle Θ the magnetomotive force being required rot obtaining a magnetic flux density $B_o$ of 2.7 teslas in a gap having a height off 4 cm (*h*=2 cm), assuming that the saturated magnetic flux density $B_s$ of iron is 2.15 teslas. Curves p1, p2, p3, p4 show magnetomotive forces required for the pole pieces having half widths of 7 cm, 10 cm, 15 cm, and 20 cm, respectively.

As the slant angle Θ becomes 60° or larger, the required magnetomotive force increases considerably. As the half width of a pole piece face becomes large, the required magnetomotive force also increases.

Assuming that the permeability of iron is infinitely large, the magnetomotive force required for obtaining a magnetic flux density of 2.7 teslas in the gap having a half height h=2 cm, is 5.4 T · cm/$\mu_{air}$, i.e., 43200 ampere-turns. $\mu_{air}$ is a permeability of air. Empirically, a bending electromagnet using a normal conducting roll can generate in practical use about $10^5$ ampere-turns or 12.5 T cm at most because of restrains such as space and a power supply.

it is preferably to design pole pieces so as to set the required magnetomotive force to 10 T cm or lower, when considering an approximation error in the equation (8). It is therefore necessary to set the pole piece half width w to 20 cm or narrower and the slant angle Θ to 60° or smaller, as seen from FIG. 9. IF the slant angle Θ is set small, the pole piece and the electromagnet become large. Therefore, the slant angle lower limit is practically about 30°. As the width of a pole piece face becomes narrow, the effective magnetic field becomes too narrow to control the electron orbit. It is therefore preferable to set the width of a pole piece face to 4 cm or wider.

The magnetomotive force required for obtaining a necessary magnetic flux density in the gap increases proportional to the height of a gap between the pole pieces. As a result, the gap height cannot be set too high. A practical value has a half gap height of 3 cm or lower.

A vertical oscillation of an electron beam is excited by a collision of the electron beam with a residual gas molecule in a vacuum pipe. If a vertical aperture of the vacuum pipe is too small, an acceptable amplitude of the vertical oscillation becomes small anti a beam loss cross section area of the gas scattering becomes large. This means that a lifetime of the stored electron beam becomes short by the gas scattering. In order to get a sufficient beam lifetime, it i,s necessary to make the vertical aperture not too small. Therefore, the magnet gap height is preferably set to 1 cm or more.

If the side wall is slanted only on one circumference side, a half width of the pole piece face is preferably set to 10 cm or less.

Next, a stepped pole piece side wall will be explained with reference to FIG. 10A and 10B.

Figure 10A:
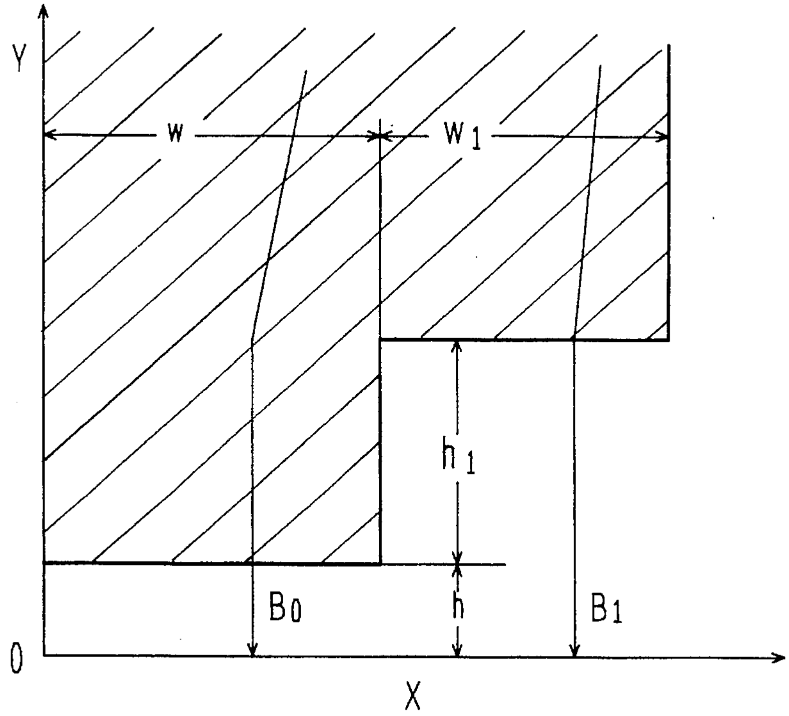
FIG. 10A is a partial cross sectional view of a pole piece explaining the principle off another embodiment of the invention.

FIG. 10A is a partial cross sectional view showing a quarter of stepped poke pieces. The electromagnet is assumed to have an infinite length in the vertical direction as viewed on the drawing sheet. The pole piece is symmetrical with Y axis. The other pole piece is disposed symmetrical with X axis. As shown in having 10A, the gap height between the pole pieces is 2 h (h is a half height), the pole piece width at the gap is 2 w (w is a half pole piece width), a step height is h,, and a step width is $w_1$. A coil is wound on the side walls at the narrower and broader pole piece regions.

Figure 10B:
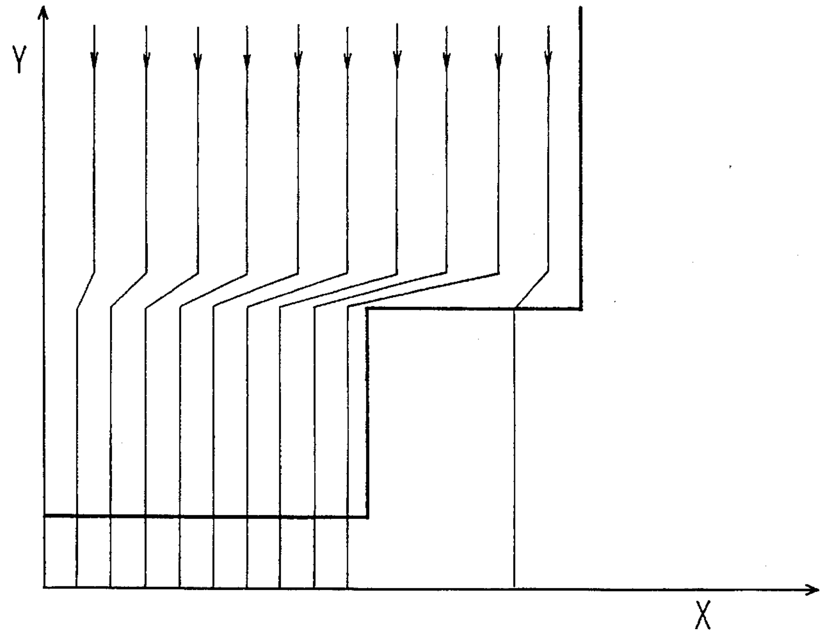
FIG. 10B shows magnetic flux lines passing through the pole piece shown in FIG. 10A.
Figure 11:
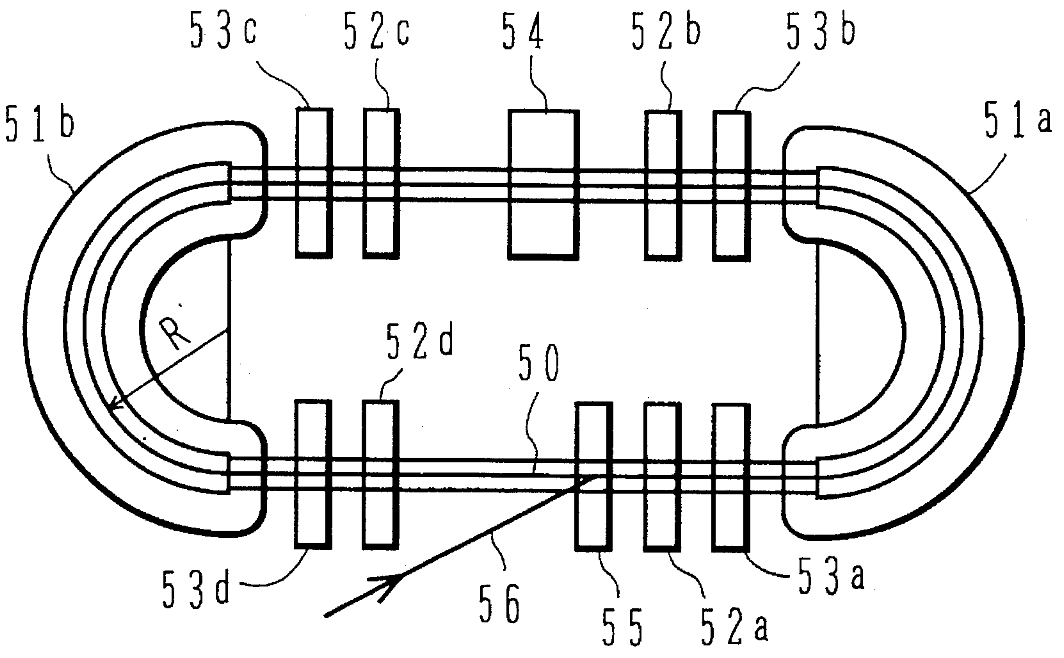
FIG. 11 is a schematic plan view of a racetrack type SR beam generator.
Figure 12A:
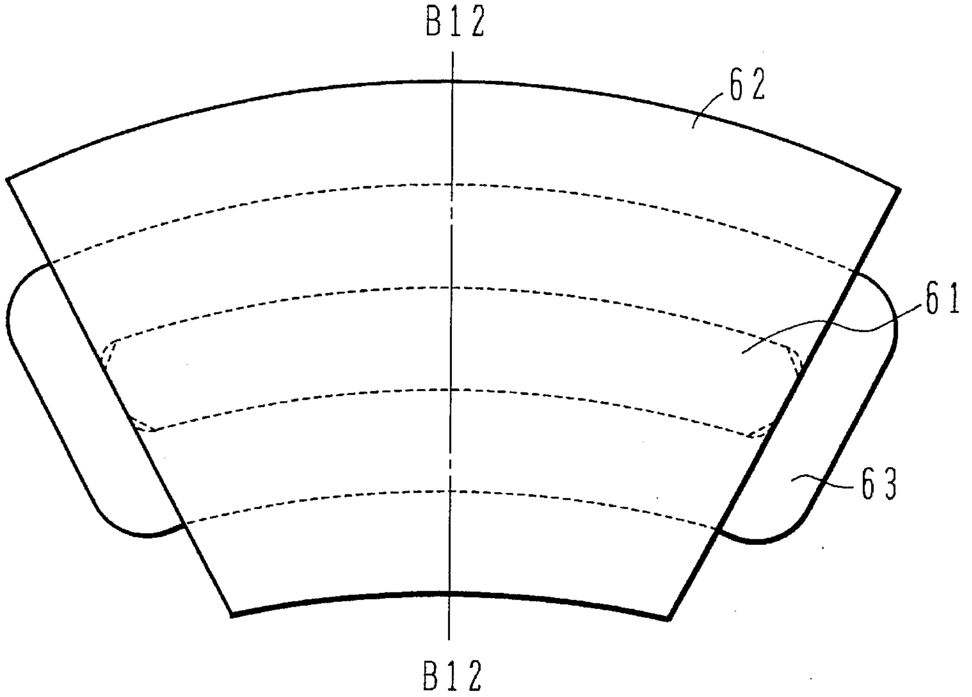
FIG.12A (PRIOR ART)
FIG. 12A is a plan view of a conventional bending electromagnet.
Figure 12B:
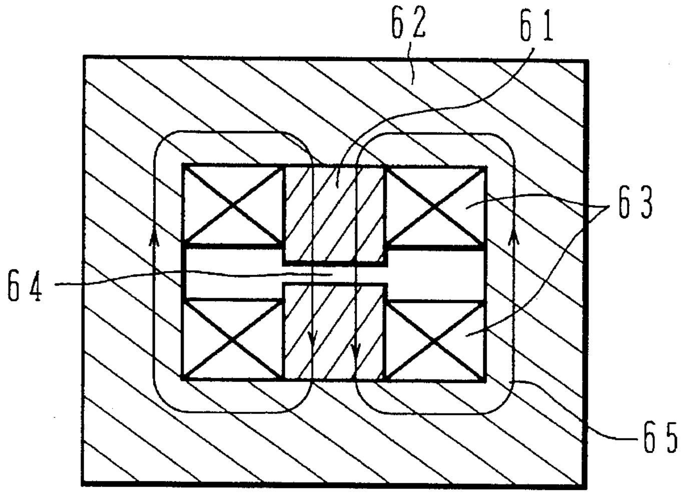
FIG.12B (PRIOR ART)
FIG. 12B is a cross sectional view of the electromagnet taken along one-dot chain line B12—B12.
Figure 13A:
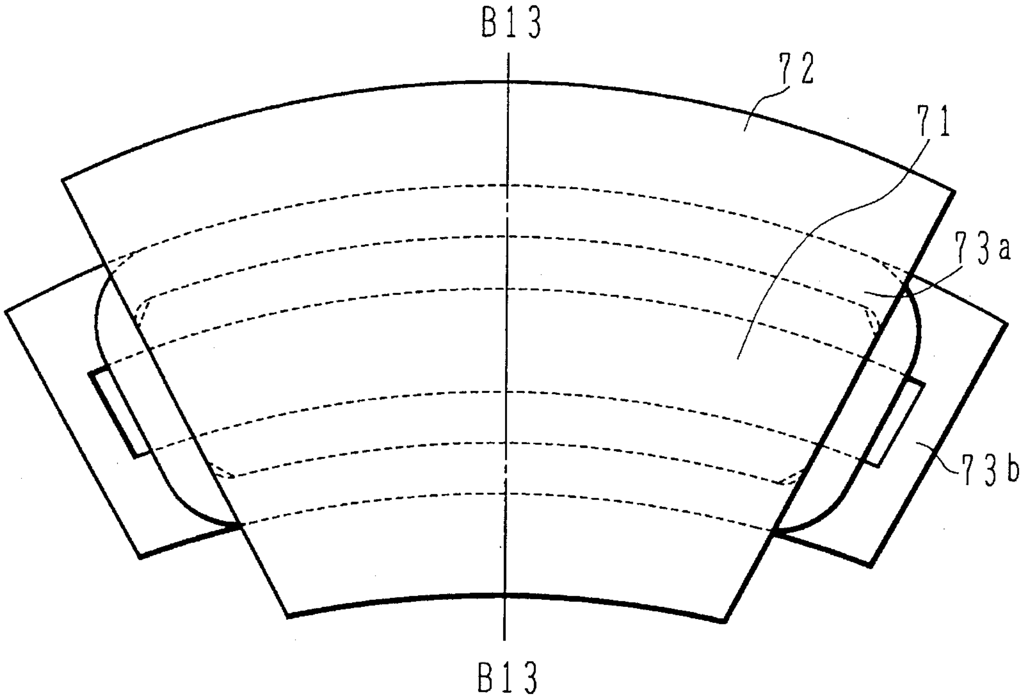
FIG.13A (PRIOR ART)
FIG. 13A is a plan view of another conventional bending electromagnet.
Figure 13B:
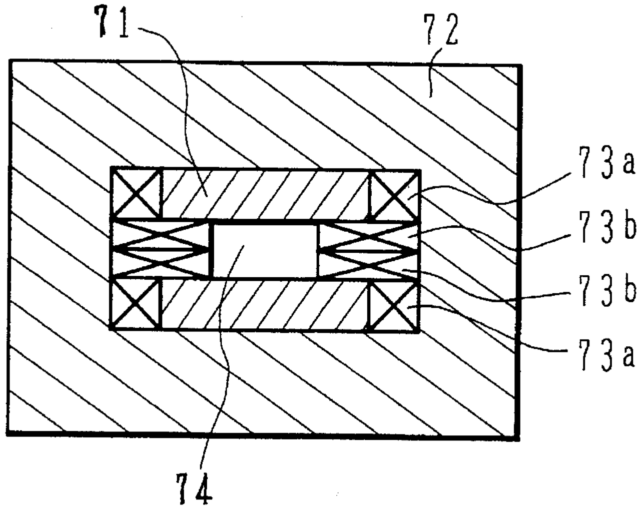
FIG.13B (PRIOR ART)
FIG. 13B is a cross sectional view of the electromagnet taken along one-dot chain line B13—B13.

For the simplicity of calculation, it is assumed as shown in FIG. 10B that the magnetic flux lines in air and in iron are aligned in a direction Y and the magnetic flux density of iron is uniform in a direction X. Under this assumptions, the magnetic flux density changes irregularly at the plane of y=h $+h_1$. The above assumptions approximately simulate a real magnetic field except the region near the plane.

In the broader pole piece region higher than $y=h+h_1$, the magnetic flux density is assumed to be lower than the saturated magnetic flux density of iron. By representing the magnetic flux density in the gap between the pole pieces by $B_o$ magnetic potential ψ in the broader pole piece region higher than y=h+h, is a constant which is given by:

$$\psi = B_oh + (B_o - B_s)h_1 \quad (9)$$

The magnetic flux density B, generated at the stepped gap by the magnetic potential is given by:

$$B_1 = \Psi_1/(h + h_1) = [B_oh + (B_o - B_s)h_1]/(h + h_1) \quad (10)$$

Since magnetic fluxes at the magnetic flux density $B_o$ at the gap between the pole pieces and at the magnetic Flux density $B_1$ at the stepped gap enter the iron, the magnetic fluxes Φ, in the broader pole piece region are given by:

$$\Phi_1 = B_ow_1 \quad (11)$$

The average magnetic flux density is therefore given by:

$$B_{iron} = \Phi_1/(w + w_1) = (B_ow + B_1w_1)/(w + w_1) = [B_ow + w_1 \cdot \{B_oh + (B_o - B_s)h_1\}/(h + h_1)]/(w + w_1) = B_o - B_sw_1h_1/(h + h_1)/(w + w_1) \quad (12)$$

In order to set this magnetic flux density to be lower than the saturated magnetic flux density of iron, it is necessary to satisfy the following inequality.

$$B_o\_w_1h_1/(h+h,)/(w+w) < B_s \quad (13)$$

The inequality is transformed into:

$$w_1h_1/(h+h_1)/(w+w_1) > B_oB_s - 1 \quad (14)$$

The left side of this inequality (14) is 1 or smaller. Therefore, the magnetic flux density $B_o$ of the electromagnet having the structure shown in FIG. 10A is two times ($2B_s$)

the saturated magnetic flux density or lower. In order to obtain a higher magnetic flux density, it is necessary to increase the number of steps or to use a combination of a stepped pole piece and a slanted pole piece. An increased number of steps are substantially equivalent to a slanted side wall.

As a design example satisfying the inequality (14), $B_o/B_s<1.4$ or $B_o<3.01$ T is obtained at h=2 cm, $h_1$=8 cm, and $w=w_1$. If $B_o$ is 2.7 T, the necessary magnetomotive force of 9.8 T is obtained from the equation (9). This design realizes an electromagnet with a coil of a practical size.

Next, the numerical analysis results of the embodiments of the invention will be described with reference to FIGS. 3A–3C, 4A–4C, 5A–5C, and 6A–6C. These figures are cross sectional views of bending electromagnets designed in accordance with the above-described discussion, showing flux distributions obtained by numerical analysis.

Bending electromagnets shown in these figures are all rotation symmetric to an axis of x=0. A return yoke is provided only on the outer circumference side, and the inner circumference side is not provided with a return yoke because the cross sectional area is too small to provide distinctive effects. The cross sectional area of each coil is generally the same, excepting that shown in FIG. 5B. A magnetic flux density obtained at the center of the gap between pole pieces is assumed to be 2.7 T.

Figure 3A:
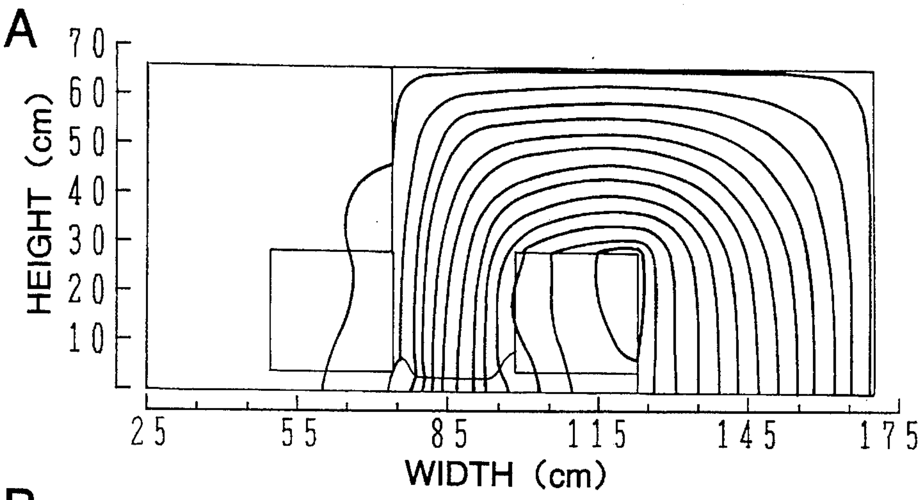
FIG. 3A to 3C, 4A to 4C, 5A to 5C and 6A to 6C are cross sectional views of bending electromagnets showing flux distributions obtained by numerical analysis.

FIG. 3A shows a typical example of a conventional bending electromagnet. A Rogowskii pole piece tip is formed at the face of each pole piece so as to make the magnetic field in the gap uniform. The magnetomotive force required for obtaining a magnetic flux density of 2.7 T is $1.84\times10^5$ ampere-turns which are far greater than $10^5$ ampere-turns practically available.

Figure 3B:
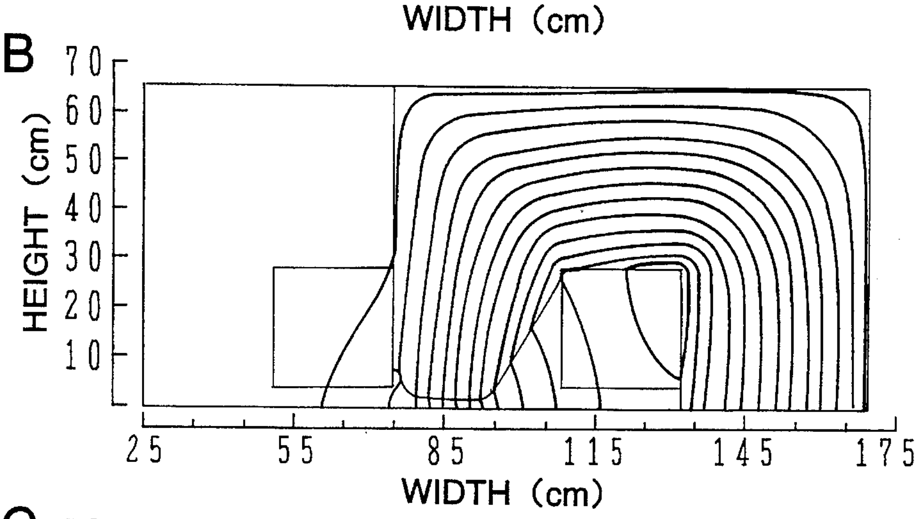

FIG. 3B shows the side wall slanted by 60° from the pole piece face on the outer circumference side. The required magnetomotive force is $1.35\times10^5$ ampere-turns. Although it is smaller than the conventional bending electromagnet shown in FIG. 3A, it is still greater than the practically available magnetomotive force.

Figure 3C:
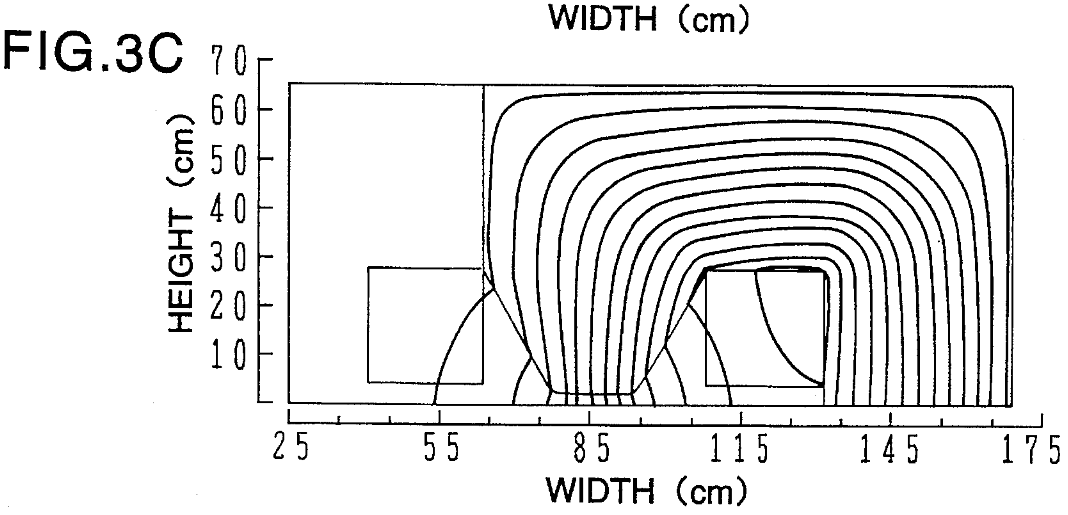

FIG. 3C shows the side wall slanted by 60° on both the outer and inner circumference sides. The required magnetomotive force is $1.04\times10^5$ ampere-turns which are near a practically available level.

Figures 4A, 4B, 4C:
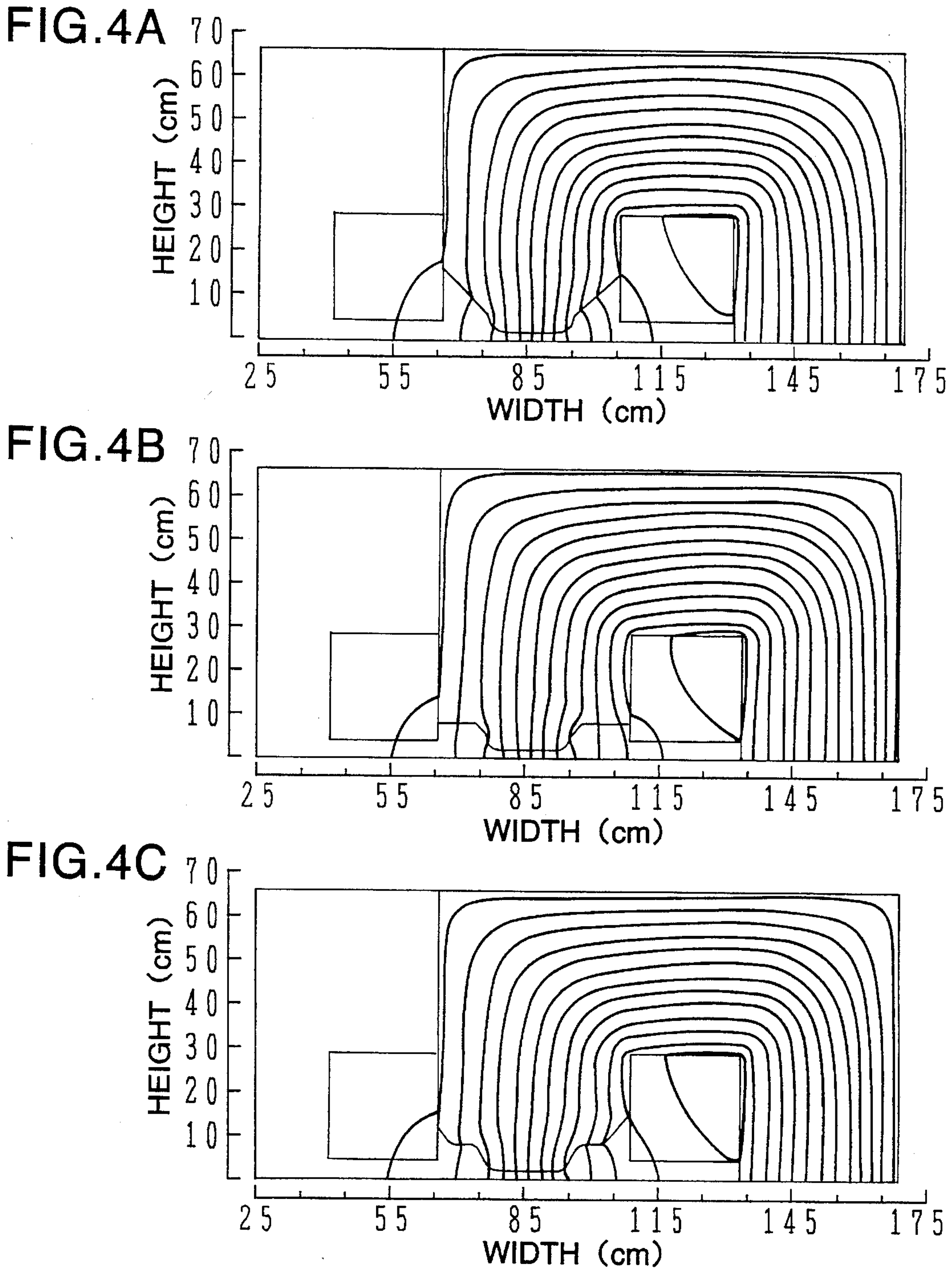

FIG. 4A shows the side wall slanted by 45° on both the outer and inner circumference sides. The required magnetomotive force is $9.4\times10^4$ ampere-turns.

FIG. 4B shows the two steps formed near the tips of the pole pieces. The required magnetomotive force is $9.9\times10^4$ ampere-turns, providing generally the same effects as FIG. 3C.

FIG. 4C shows the two steps formed near the tips of the pole pieces and the slanted side walls formed on both the inner and outer circumference sides at the horizontal region of the second step. The required magnetomotive force is $8.9\times10^4$ ampere-turns, being further reduced.

Figure 5A:
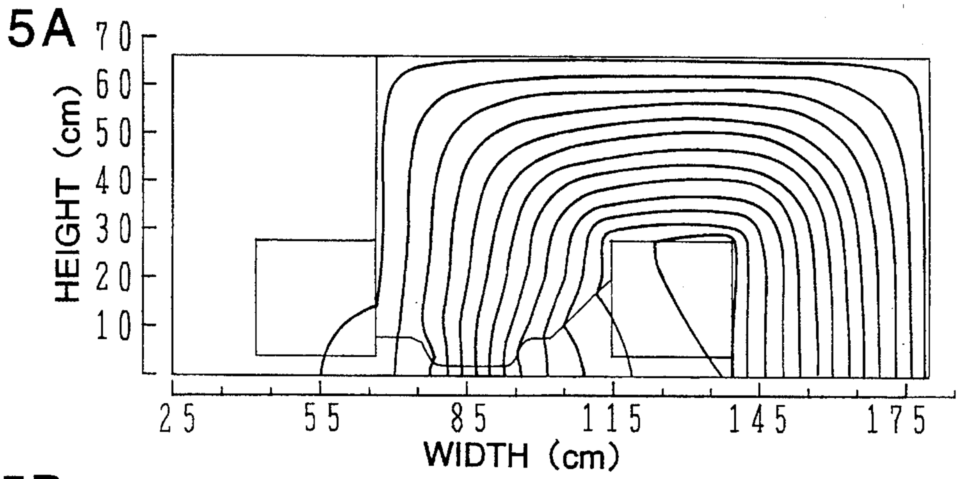

FIG. 5A shows the two steps formed near the tips of the pole pieces and the slanted side walls formed only on the outer circumference sides at the horizontal region of the second step. The required magnetomotive force is $8.7\times10^4$ ampere- turns.

Figure 5B:
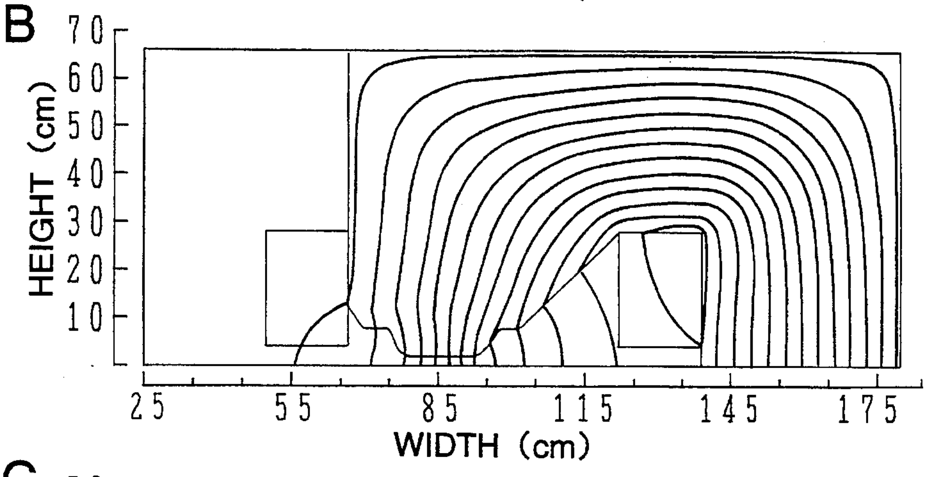
Figure 5C:
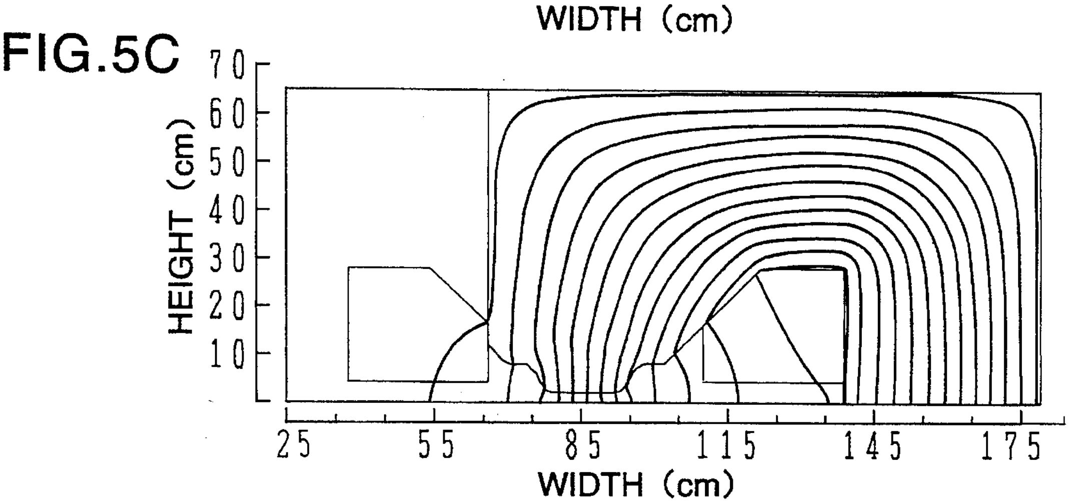

FIGS. 5B and 5C show the slanted side wall on the outer circumference side shown in FIG. 5A extended to the base of the pole pieces. The cross sectional area of the coil shown in FIG. 5B is smaller than that shown in FIG. 5A. The required magnetomotive forces are both about $8.3\times10^4$ ampere-turns, showing no adverse effects of the reduced coil cross sectional area.

Figure 6A:
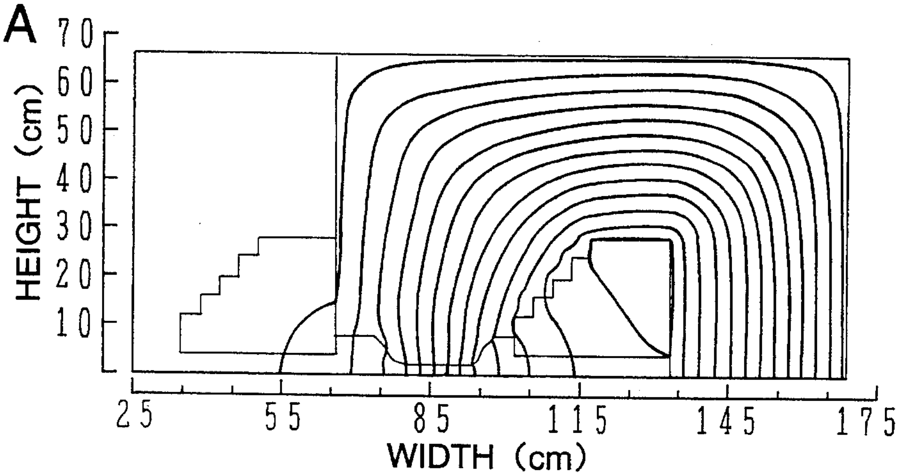

FIG. 6A shows the slanted side wall shown in FIG. 5C approximated by a number of steps. The required magnetomotive force is $8.8\times10^4$ ampere-turns slightly larger than that shown in FIG. 5C. This results from an increase of an effective pole piece width.

Figure 6B:
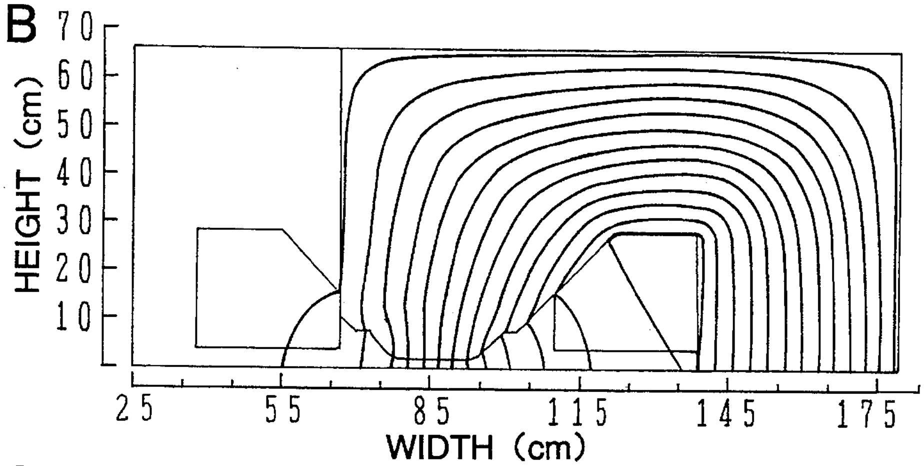

FIG. 6B shows the side wall at the step near the pole piece face shown in FIG. 5C replaced by a side wall slanted by 45° continuously extending from the Rogowskii pole piece tip. The required magnetomotive force can be reduced further to $8.0\times10^4$ ampere-turns.

Figure 6C:
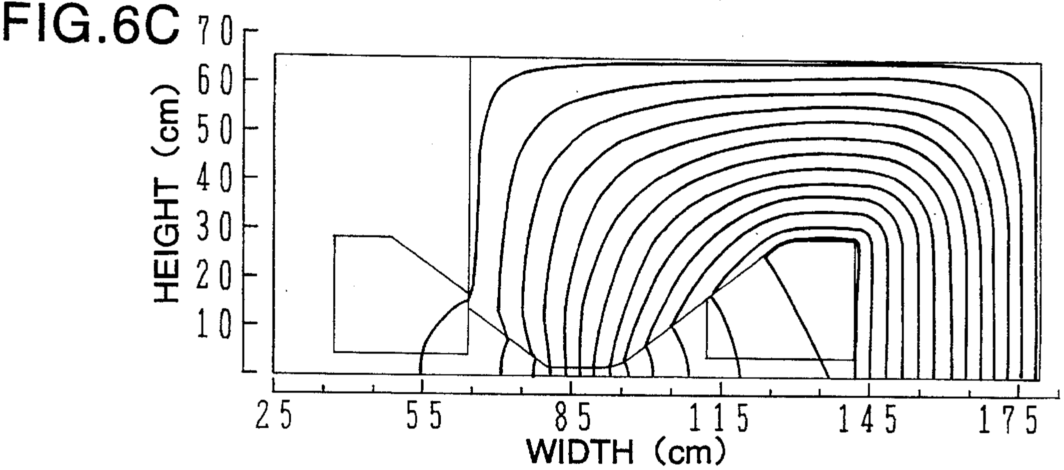

FIG. 6C shows the side wall slanted by about 37° and continuously extending from the Rogowskii pole piece tip, without no step. This smaller slanted angle allows the required magnetomotive force to further reduce to $7.7\times10^4$ ampere-turns, although the smaller slanted angle results in a large size of pole pieces and electromagnet.

As seen from the above numerical analysis, the devised shape of pole pieces allows a magnetic field having a flux density of 2.7 T to be generated by a practically available magnetomotive force by using a normal conducting electromagnet.

The present invention has been described in connection with the preferred embodiments. The invention is not limited only to the above embodiments. It is apparent to those skilled in the art that various modifications, improvements, combinations and the like can be made without departing from the scope of the appended claims.

I claim:

1. A normal conducting bending electromagnet comprising:

a pair of pole pieces having respective pole piece faces, said pole pieces being disposed with the pole piece faces thereof facing each other with a substantially constant gap therebetween, a magnetic field for forming a charged particle beam arc orbit being generated in said gap between said pole pieces;

a yoke coupled to said pole pieces for forming a closed magnetic circuit with said gap; and a pair of coils for generating a magnetomotive force and generating magnetic fluxes in said magnetic circuit, wherein:

at least one side wall of each of said pole pieces is slanted or stepped along a virtual slanted plane at least partially along the magnetic path of said pole pieces, said slanted side wall or said virtual slanted plane having a slant angle in the range from 30° to 60° relative to said pole piece faces, and the pole piece width at the plane coupling to said yoke being set wider than the width of said pole piece faces with said gap being interposed therebetween;

the width of said pole piece face is in the range from 4 cm to 20 cm;

said gap has a height along the magnetic path which is in the range from 1 cm to 6 cm; and said at least one slanted or stepped side wall of each of said pole pieces includes a stepped portion having at least three steps.

2. A normal conducting bending electromagnet comprising:

a pair of pole pieces having respective pole piece faces, said pole pieces being disposed with the pole piece faces thereof facing each other with a substantially constant gap therebetween, a magnetic field for forming a charged particle beam arc orbit being generated in said gap between said pole pieces;

a yoke coupled to said pole pieces for forming a closed magnetic circuit with said gap; and a pair of coils for generating a magnetomotive force and generating magnetic fluxes in said magnetic circuit, wherein:

both side walls of each of said pole pieces are slanted or stepped along a virtual slanted plane at least partially along the magnetic path of said pole pieces, said slanted side wall or said virtual slanted plane having a slant angle in the range from 30° to 60° relative to said pole piece faces, and the pole piece width at the plane coupling to said yoke being set wider than the width of said pole piece faces with said gap being interposed therebetween;

the width of said pole piece face is in the range from 4 cm to 40 cm; and said gap has a height along the magnetic path which is in the range from 1 cm to 6 cm; and said side walls of said pole pieces each include a stepped portion having at least three steps.

3. A normal conducting bending electromagnet comprising:

a pair of pole pieces disposed with the pole piece faces facing each other, a magnetic field for forming a charged particle beam arc orbit being generated in a gap between said pole pieces;

a yoke coupled to said pole pieces for forming a closed magnetic circuit with said gap; and a pair of coils for generating a magnetomotive force and generating magnetic fluxes in said magnetic circuit, wherein at least one side wall of each of said pole pieces along the magnetic path is formed stepwise having one step, and the relationship between $w_y$, $w_g$, $\underline{h}$, and $h_1$ is set so as to satisfy $$(w_y - w_g)h_1/[w_y(h+h_1)] > B_o/2.15 - 1$$

in order to generate a magnetic field having a magnetic flux density $B_o$ (tesla) in said gap, wherein $w_y$ (cm) represents a width of said pole piece on said yoke side, $w_g$ (cm) represents a width of said pole piece on said gap side, $h_1$ (cm) represents a height of the step, and h (cm) represents a half height of said gap along the magnetic path.

4. A normal conducting bending electromagnet comprising:

a pair of pole pieces having respective pole piece faces, said pole pieces being disposed with the pole piece faces facing each other with a substantially constant gap therebetween, a magnetic field for forming a charged particle beam arc orbit being generated in said gap between said pole pieces;

a yoke coupled to said pole pieces for forming a closed magnetic circuit with said gap; and a pair of coils for generating a magnetomotive force and generating magnetic fluxes in said magnetic circuit, wherein at least one side wall of each of said pole pieces along the magnetic path is formed stepwise having one step so as to set the pole piece width on the yoke side wider than the pole piece width on the gap side, and said normal conducting bending electromagnet further includes a controller for controlling a current flowing through said pair of coils so as to set the magnetic flux density in said pole pieces to at least 2.15 teslas at the narrower pole piece width region on the gap side and to no more than 2.15 teslas at the broader pole piece width region on the yoke side.

5. A normal conducting bending electromagnet according to claim 4, wherein both side walls of each of said pole pieces are formed with one step along the magnetic path.

6. A normal conducting bending electromagnet comprising:

a pair of pole pieces having respective pole piece faces, said pole pieces being disposed with the pole piece faces thereof facing each other with a substantially constant gap therebetween, a magnetic field for forming a charged particle beam arc orbit being generated in said gap between said pole pieces;

a yoke coupled to said pole pieces for forming a closed magnetic circuit with said gap; and a pair of coils for generating a magnetomotive force and generating magnetic fluxes in said magnetic circuit, wherein:

at least one side wall of each of said pole pieces is slanted or stepped along a virtual slanted plane at least partially along the magnetic path of said pole pieces, said slanted side wall or said virtual slanted plane having a slant angle in the range from 30° to 60° relative to said pole piece faces, and the pole piece width at the plane coupling to said yoke being set wider than the width of said pole piece faces with said gap being interposed therebetween;

the width of said pole piece face is in the range from 4 cm to 20 cm; and said gap has a height along the magnetic path which is in the range from 1 cm to 6 cm.; and said at least one side wall includes a first plane formed along said side wall, a second plane formed along said side wall and disposed nearer to said yoke than said first plane, and a third plane generally in parallel to said pole piece face, said third plane coupling said first and second planes.

7. A normal conducting bending electromagnet comprising:

a pair of pole pieces having respective pole piece faces, said pole pieces being disposed with the pole piece faces thereof facing each other with a substantially constant gap therebetween, a magnetic field for forming a charged particle beam arc orbit being generated in said gap between said pole pieces;

a yoke coupled to said pole pieces for forming a closed magnetic circuit with said gap; and a pair of coils for generating a magnetomotive force and generating magnetic fluxes in said magnetic circuit, wherein:

both side walls of each of said pole pieces are slanted or stepped alone a virtual slanted plane at least partially along the magnetic path of said pole pieces, said slanted side wall or said virtual slanted plane having a slant angle in the range from 30° to 60° relative to said pole piece faces, and the pole piece width at the plane coupling to said yoke being set wider than the width of said pole piece faces with said gad being interposed therebetween;

the width of said pole piece face is in the range from 4 cm to 40 cm; and said gap has a height along the magnetic path which is in the range from 1 cm to 6 cm; and said side walls include a first plane formed along said side walls, a second plane formed along said side walls and disposed nearer to said yoke than said first plane, and a third plane generally in parallel to said pole piece faces, said third plane coupling said first and second planes.

8. A normal conducting bending electromagnet according claim 7, wherein the height of said second plane is higher than said first plane on the outer circumference side of said side walls.

9. A normal conducting bending electromagnet comprising:

a pair of pole pieces having respective pole piece faces, said pole pieces being disposed with the pole piece faces thereof facing each other with a substantially constant gap therebetween, a magnetic field for forming a charged particle beam arc orbit being generated in said gap between said pole piece;

a yoke coupled to said pole pieces for forming a closed magnetic circuit with said gap; and a pair of coils for generating a magnetomotive force and generating magnetic fluxes in said magnetic circuit, wherein:

both side walls of each of said pole pieces are slanted or stepped along a virtual slanted plane at least partially along the magnetic path of said pole pieces, said slanted side wall or said virtual slanted plane having a slant angle in the range from 30° to 60° relative to said pole piece faces, and the pole piece width at the plane coupling to said yoke being set wider than the width of said pole piece faces with said gap being interposed therebetween;

the width of said pole piece face is in the range from 4 cm to 40 cm; and said gap has a height along the magnetic path which is in the range from 1 cm to 6 cm; and the height of said side walls is higher on an outer circumference side than on an inner circumference side.

10. A normal conducting bending electromagnet comprising:

a pair of pole pieces having respective pole piece faces, said pole pieces being disposed with the pole piece faces thereof facing each other, a magnetic field for forming a charged particle beam arc orbit being generated in a gap between said pole pieces;

a yoke coupled to said pole pieces for forming a closed magnetic circuit with said gap;

a pair of coils for generating a magnetomotive force and generating magnetic fluxes in said magnetic circuit; and a controller for controlling a current flowing through said pair of coils so as to generate a magnetic field having a magnetic flux density in the range from 2.15 teslas to 3 teslas and to set the magnetic flux density in said pole pieces to at least 2.15 teslas at said pole piece and to no more than 2.15 teslas at the plane coupling to said yoke, wherein:

at least one side wall of each of said pole pieces is slanted or stepped along a virtual slanted plane at least partially along the magnetic path of said pole pieces, said slanted side wall or said virtual slanted plane having a slant angle in the range from 30° to 60° relative to said pole piece faces, and the pole piece width at the plane coupling to said yoke being set wider than the width of said pole piece faces with said gap being interposed therebetween;

the width of said pole piece face is in the range from 4 cm to 20 cm; and said gap has a height along the magnetic path which is in the range from 1 cm to 6 cm.

11. A normal conducting bending electromagnet comprising:

a pair of pole pieces having respective pole piece faces, said pole pieces being disposed with the pole piece faces thereof facing each other, a magnetic field for forming a charged particle beam arc orbit being generated in a gap between said pole pieces;

a yoke coupled to said pole pieces for forming a closed magnetic circuit with said gap;

a pair of coils for generating a magnetomotive force and generating magnetic fluxes in said magnetic circuit; and a controller for controlling a current flowing through said pair of coils so as to generate a magnetic field having a magnetic flux density in the range from 2.15 teslas to 3 teslas and to set the magnetic flux density in said pole pieces to at least 2.15 teslas at said pole piece face and to no more than 2.15 teslas at the plane coupling to said yoke, wherein:

both the side walls of each of said pole pieces are slanted or stepped along a virtual slanted plane at least partially along the magnetic path of said pole pieces, said slanted side wall or said virtual slanted plane having a slant angle in the range from 30° to 60° relative to said pole piece faces, and the pole piece width at the plane coupling to said yoke being set wider than the width of said pole piece faces with said gap being interposed therebetween;

the width of said pole piece face is in the range from 4 cm to 40 cm; and said gap has a height along the magnetic path which is in the range from 1 cm to 6 cm.

12. A normal conducting bending electromagnet comprising:

a pair of pole pieces having respective pole piece faces, said pole pieces being disposed with the pole piece faces thereof facing each other with a substantially constant gap therebetween, a magnetic field for forming a charged particle beam arc orbit being generated in said gap between said pole pieces;

a yoke coupled to said pole pieces for forming a closed magnetic circuit with said gap; and a pair of coils for generating a magnetomotive force and generating magnetic fluxes in said magnetic circuit, wherein:

at least one side wall of each of said pole pieces is slanted or stepped along a virtual slanted plane at least partially along the magnetic path of said pole pieces, said slanted side wall or said virtual slanted plane having a slant angle in the range from 30° to 60° relative to said pole piece faces, and the pole piece width at the plane coupling to said yoke being set wider than the width of said pole piece faces with said gap being interposed therebetween;

the width of said pole piece face is in the range from 4 cm to 20 cm;

said gap has a height along the magnetic path which is in the range from 1 cm to 6 cm; and the relationship between $Y_o$, $\underline{a}$, $\underline{h}$, and $\underline{w}$ is set so as to satisfy $$B_o/2.15 - \tfrac{1}{2} \cdot (1 - h/a/w)^{-2} \cdot \{\ln(1 + y_o/a/w) - y_o/(aw + y_o)\} - \tfrac{1}{2} \cdot \{1 - (1 - h/a/w)^{-2}\} \cdot \{\ln(1 + y_o/h) - aw/h \cdot y_o/(aw + y_o)\} < 1$$

in order to generate a magnetic field having a magnetic flux density $B_o$ (tesla) in said gap, wherein $Y_o$ (cm) represents a height at a point on said slanted or stepped side wall of each of said pole pieces along the magnetic path, a represent a tangent of said slant angle, $\underline{h}$ (cm) represents a half of the height of said gap along the magnetic path, and $\underline{w}$ (cm)

represents a width of said pole piece face if one side wall is slanted or stepped or a half of the width of said pole piece face if both side walls are slanted or stepped.

13. A normal conducting bending electromagnet comprising:

a pair of pole pieces having respective pole piece faces, said pole pieces being disposed with the pole piece faces thereof facing each other with a substantially constant gap therebetween, a magnetic field for forming a charged particle beam arc orbit being generated in said gap between said pole pieces;

a yoke coupled to said pole pieces for forming a closed magnetic circuit with said gap; and a pair of coils for generating a magnetomotive force and generating magnetic fluxes in said magnetic circuit, wherein:

both side walls of each of said pole pieces are slanted or stepped along a virtual slanted plane at least partially along the magnetic path of said pole pieces, said slanted side wall or said virtual slanted plane having a slant angle in the range from 30° to 60° relative to said pole piece faces, and the pole piece width at the plane coupling to said yoke being set wider than the width of said pole piece faces with said gap being interposed therebetween;

the width of said pole piece face is in the range from 4 cm to 40 cm;

said gap has a height along the magnetic path which is in the range from 1 cm to 6 cm; and wherein the relationship between $Y_o$, a, a, and w is set so as to satisfy in order to generate a magnetic field having a magnetic flux density $B_o$ (tesla) in said gap, wherein $Y_o$ (cm) represents a height at a point on said slanted or stepped side wall of each of said pole pieces along the magnetic path, a represent a tangent of said slant angle, h (cm) represents a half of the height of said gap along the magnetic path, and w (cm) represents a half of the width of said pole piece face.

* * * * *

UNITED STATES PATENT AND TRADEMARK OFFICE

CERTIFICATE OF CORRECTION

PATENT NO. : 5,568,109

DATED : October 22, 1996

INVENTOR(S) : Takeshi TAKAYAMA

It is certified that error appears in the above-indentified patent and that said Letters Patent is hereby corrected as shown below:

Title Page, Item [57] ABSTRACT line 1, delete ":"

lines 3, 12 and 16, delete ";"

line 5, change ";" to --,-- line 6, delete ","

line 7, after "yoke" insert --is-- line 16, after "30°" delete "or" and insert --to 60°-- line 17, delete "smaller"

line 18, delete "or wider"

line 20, delete "or higher".

Signed and Sealed this

Eighth Day of July, 1997

Attest:

BRUCE LEHMAN

Attesting Officer

*Commissioner of Patents and Trademarks*